US012672558B2

(12) United States Patent
Foo et al.

(10) Patent No.: US 12,672,558 B2
(45) Date of Patent: Jun. 30, 2026

(54) PACKAGE SUBSTRATE WITH POWER DELIVERY NETWORK

(71) Applicant: Altera Corporation, San Jose, CA (US)

(72) Inventors: Loke Yip Foo, Bayan Lepas (MY); Teong Guan Yew, Batu Maung (MY); Bok Eng Cheah, Gelugor (MY)

(73) Assignee: Altera Corporation, San Jose, CA (US)

( * ) Notice: Subject to any disclaimer, the term of this patent is extended or adjusted under 35 U.S.C. 154(b) by 371 days.

(21) Appl. No.: 17/503,408

(22) Filed: Oct. 18, 2021

(65) Prior Publication Data

US 2023/0119525 A1    Apr. 20, 2023

(51) Int. Cl.
*H10W 70/63*      (2026.01)
*H10W 70/05*      (2026.01)
*H10W 70/685*     (2026.01)
*H10W 90/00*      (2026.01)

(52) U.S. Cl.
CPC ......... *H10W 70/635* (2026.01); *H10W 70/05* (2026.01); *H10W 70/095* (2026.01); *H10W 70/685* (2026.01); *H10W 90/00* (2026.01)

(58) Field of Classification Search
CPC ........... H01L 23/49827; H01L 21/4857; H01L 21/486; H01L 23/49822; H01L 25/16; H10W 70/635; H10W 70/685; H10W 90/00; H10W 70/095; H10W 70/05
See application file for complete search history.

(56) References Cited

U.S. PATENT DOCUMENTS

| | | | |
|---|---|---|---|
| 2006/0118931 A1* | 6/2006 | Ho | H01L 23/49827 257/E23.062 |
| 2007/0108552 A1* | 5/2007 | Wan | H05K 1/162 257/532 |
| 2013/0105943 A1* | 5/2013 | Lai | H01G 4/30 257/532 |
| 2013/0258623 A1* | 10/2013 | Zeng | H05K 1/186 29/840 |
| 2015/0351247 A1* | 12/2015 | Kwon | H01L 23/5389 29/841 |
| 2019/0239362 A1* | 8/2019 | Yang | H01L 21/4857 |
| 2020/0058569 A1* | 2/2020 | Cho | H01L 23/49822 |

* cited by examiner

*Primary Examiner* — Norman D Richards
*Assistant Examiner* — Sean Ayers Winters
(74) *Attorney, Agent, or Firm* — Viering Jentschura & Partner mbB

(57) ABSTRACT

The present disclosure is directed generally to semiconductor packages, semiconductor package substrates, and methods for making them, which include packages substrates with embedded passive devices positioned between plated through hole vias configured for an improved power delivery network.

17 Claims, 14 Drawing Sheets

100

103

102

101 d1 d2

200

203

202

201

300

Prior Art

301

302 a1

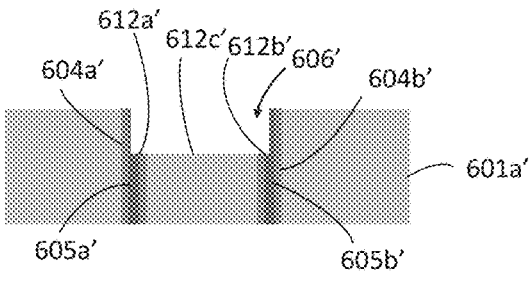
FIG. 6D
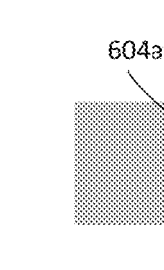
FIG. 6D'
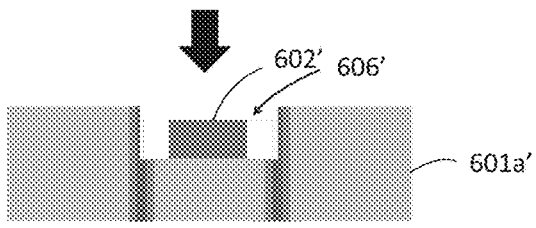
FIG. 6E
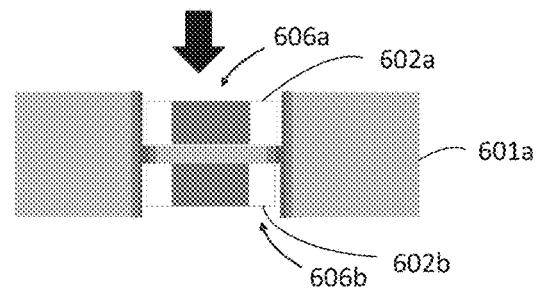
FIG. 6E'
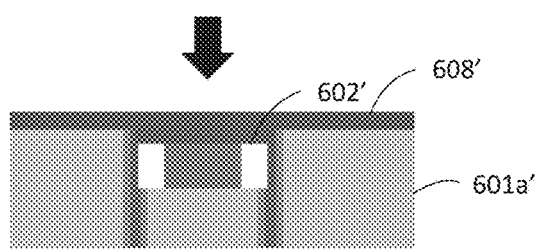
FIG. 6F
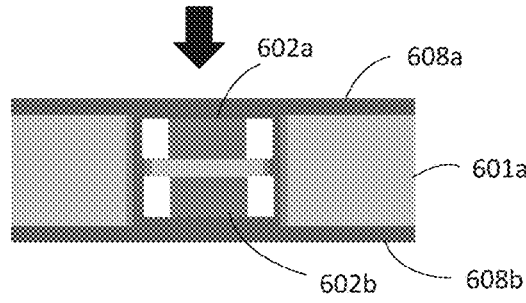
FIG. 6F'

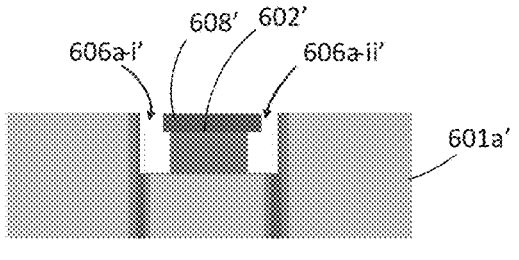
FIG. 6G
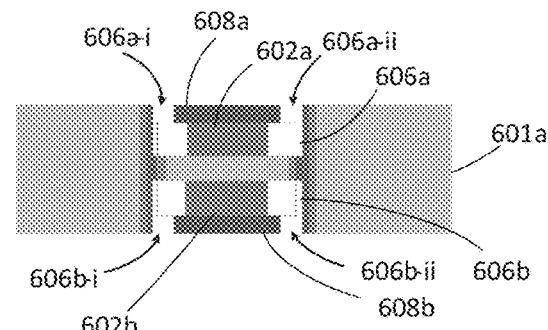
FIG. 6G'
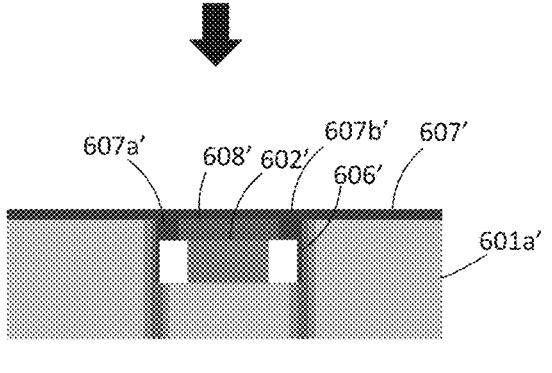
FIG. 6H
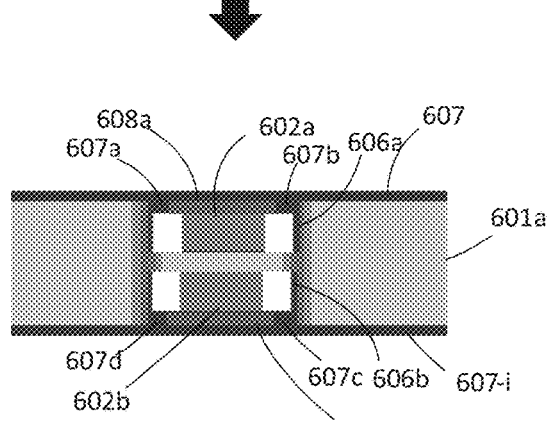
FIG. 6H'

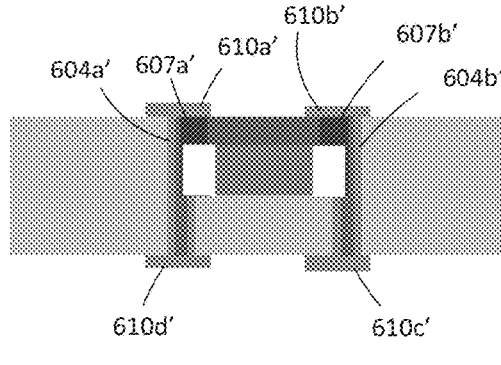
FIG. 6I
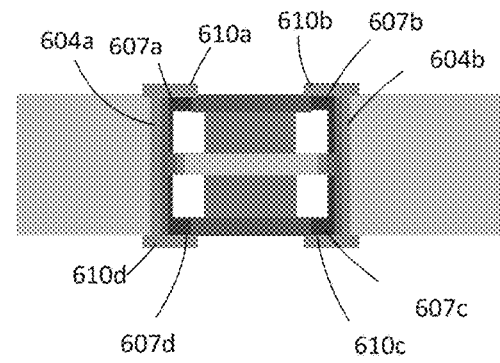
FIG. 6I'
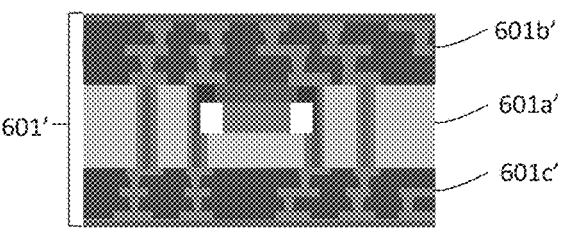
FIG. 6J
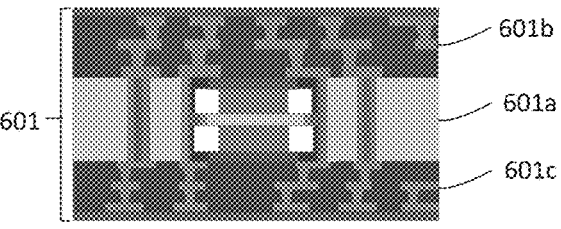
FIG. 6J'

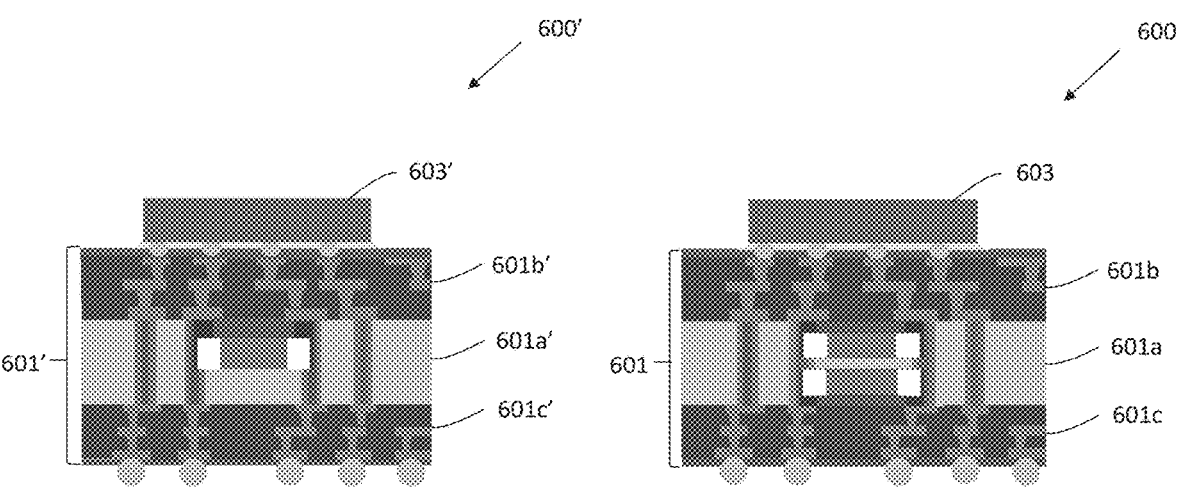
FIG. 6K'                    FIG. 6K

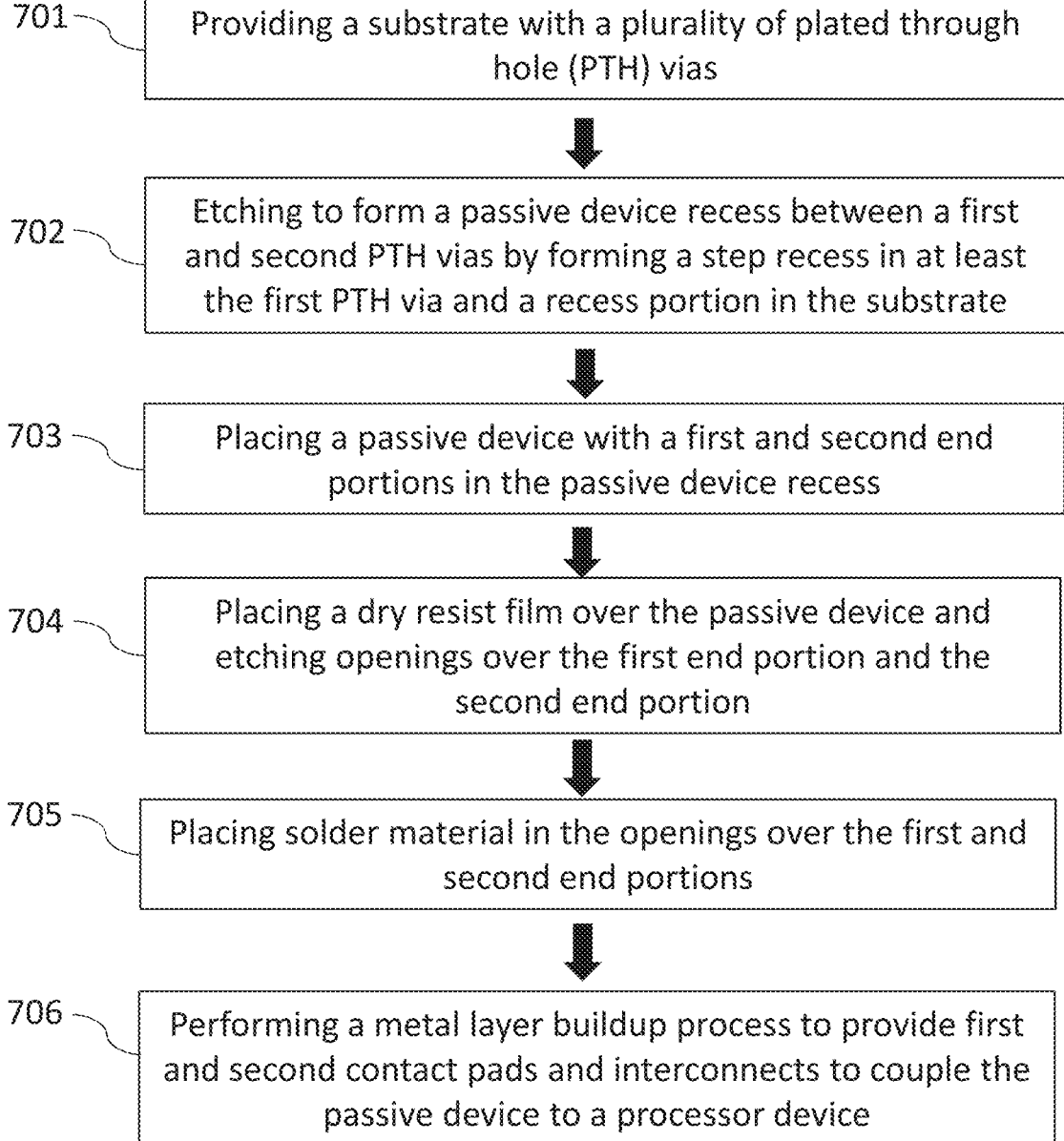

701 — Providing a substrate with a plurality of plated through hole (PTH) vias

702 — Etching to form a passive device recess between a first and second PTH vias by forming a step recess in at least the first PTH via and a recess portion in the substrate 703 — Placing a passive device with a first and second end portions in the passive device recess 704 — Placing a dry resist film over the passive device and etching openings over the first end portion and the second end portion 705 — Placing solder material in the openings over the first and second end portions 706 — Performing a metal layer buildup process to provide first and second contact pads and interconnects to couple the passive device to a processor device

CAMERA

ANTENNA

SRAM

SRAM

COMMUNICATION CHIP 802

COMMUNICATION CHIP

PACKAGE 800

CHIPSET

AMP

DRAM

ROM

TOUCHSCREEN CONTROLLER

GPS

COMPASS

801

MOTHERBOARD

SPEAKER

BATTERY

TOUCHSCREEN DISPLAY

PACKAGE SUBSTRATE WITH POWER DELIVERY NETWORK

BACKGROUND

To enable greater miniaturization, semiconductor packaging technology is using, among other approaches, die stacking to incorporate two or more chiplets into a vertical assembly and embedded components to address the challenges of form-factor expansion. These approaches have impacted device placement, interconnect designs, and their electrical properties, as well as reliability, when signals are propagating through extensive transmission lines across the package substrate to a printed circuit board (PCB) and through multiple interconnect transitions, e.g., vertical vias, capacitive solder balls, sockets, and/or plated-through-hole (PTH) structures. In addition, there may be a need to improve power integrity in packaging designs as a consequence of scaling transistors, interconnect dimensions, and increasing operating frequencies.

For 2.5D and/or 3D packaging approaches, there may be increased power loop inductance, a higher resistance in the TSV interconnects, and package form-factor expansion. In particular, the performance of a semiconductor package may be impacted by constraints caused by its power delivery network (PDN). There may be disruptions between the power and ground planes, for example, resulting from having a power plane configured far apart from a ground plane and discontinuities in the power and/or ground planes due to signal routing congestion. The disruptions of the power and ground planes have sought to be addressed by increasing the capacitance requirements through using thin dielectrics, embedded capacitance, high-frequency decoupling capacitors, and other methods. In addition, it is also known that interconnect/wire sizing and placement may have a significant impact on inductance loops and signal delay to affect the performance of devices and circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 6A through 6K and 6D' through 6K' show cross-sectional views of present semiconductor substrates with embedded passive devices at different stages for exemplary process flows for making such semiconductor substrates according to aspects of the present disclosure;

FIG. 7 shows a simplified flow diagram for an exemplary method for making semiconductor packages with embedded passive devices according to an aspect of the present disclosure.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Figure 1:
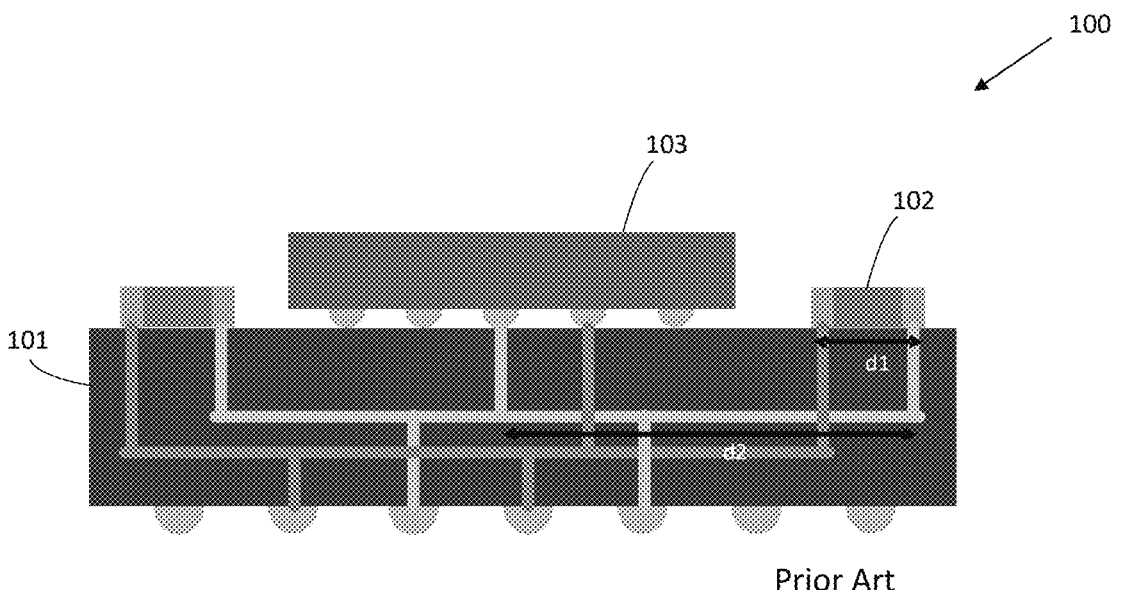
FIG. 1 shows an example of an existing semiconductor package.

In FIG. 1, an existing semiconductor package 100 is shown having an "on-package" passive device 102 (e.g., a decoupling capacitor) positioned adjacent to a silicon device 103 on an upper surface of a semiconductor package substrate 101. Decoupling capacitors are foundational to enabling high performance in a semiconductor system. However, they may consume a sizable amount of real estate on the package substrate 101, as represented by $d_1$, thus pose a challenge to device and/or platform miniaturization. In addition, there may be a delay due to a distance needed for the power supply connection, as represented by $d_2$, between the silicon device 103 and the decoupling capacitor 102.

Figure 2:
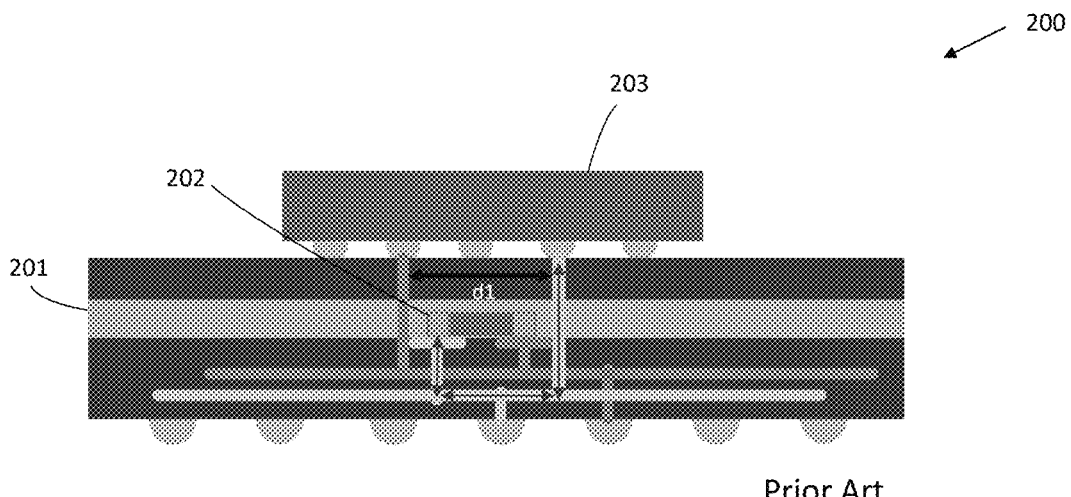
FIG. 2 shows another example of an existing semiconductor package.

As shown in FIG. 2, an existing semiconductor package 200 that mitigates package form factor expansion may embed a passive device 202 in a semiconductor package substrate 201 under a silicon device 203. The disadvantages of existing embedded capacitor solutions include limitations on interconnect and component placement for electrical performance and reduced flexibility for physical real-estate optimization, e.g., restricting plated through hole (PTH) interconnects pitch geometries $d_1$ to greater than the width of embedded passive component(s) and looped interconnections to the passive components (as shown by the routing arrows).

Figure 3:
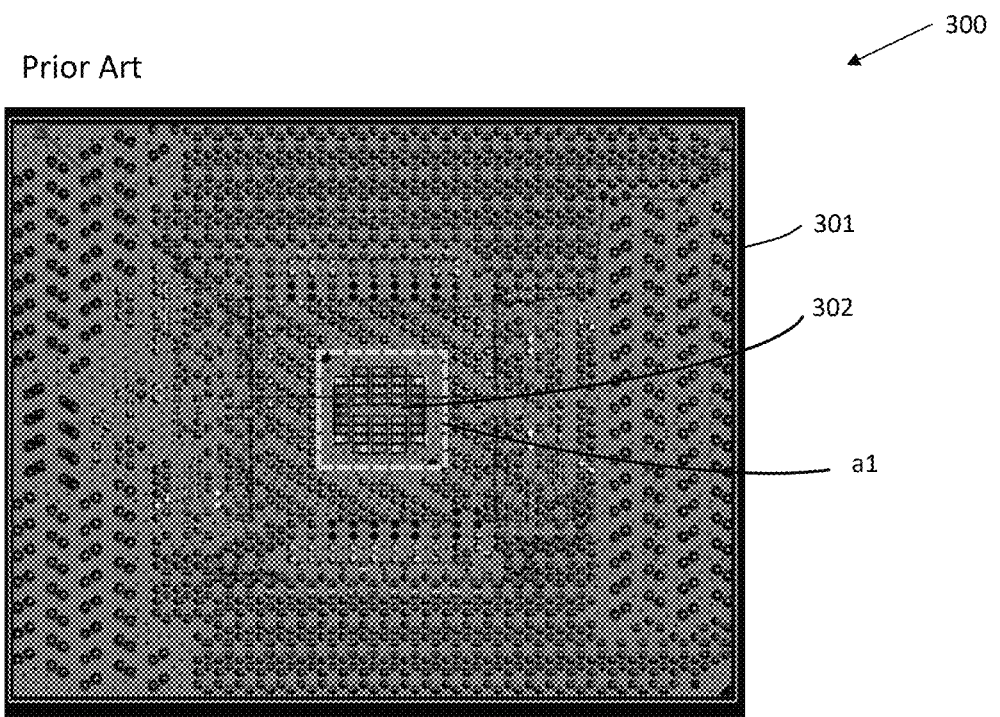
FIG. 3 shows a bottom view layout of an existing semiconductor package.

FIG. 3 shows a bottom view layout of an existing semiconductor package that places passive devices 302 on the bottom surface, in al (i.e., a "keep-out-zone" (KOZ) shown by the dashed lines), of a semiconductor package substrate 301. While this approach avoids using on-package real estate, it may require increasing the size of the package land-side solder ball grid array (BGA) to accommodate the placement of the passive devices 302. Therefore, an increase in the KOZ for passive device placement may lead to a trade-off between increased BGA input-output (I/O) density and package form-factor expansion.

To address the aforementioned shortcomings, a first technical advantage of the present disclosure may include, but is not limited to, improved semiconductor package miniaturization through providing PTH pitch scaling. In particular, the pitch between a first PTH via associated with a power supply (Vcc) and a second PTH associated with a reference ground (Vss) may be reduced by footprint encroachments by one or more vertically stacked embedded decoupling capacitors configured there between.

In addition, a second technical advantage of the present disclosure may include, but is not limited to, improved power integrity through enhanced capacitance density and reduced inductance loops. In particular, a plurality of decoupling capacitors may be positioned in proximity to a silicon device using a stacked configuration in an embedded array, as compared to the on-board and/or on-package placement of capacitors.

Finally, a third technical advantage of the present disclosure may include, but is not limited to, increasing the BGA IO density for a semiconductor package through eliminating/minimizing the BGA cavity needed for attaching decoupling capacitors on the semiconductor package landside.

According to aspects of the present disclosure, to obtain the aforementioned technical advantages, semiconductor packages may be provided that includes a semiconductor device positioned over a semiconductor substrate with a core layer having a top and bottom surfaces and a plurality of plated through hole vias. The plurality of plated through hole vias includes a first plated through hole via having a first top recess step and a second plated through hole via may or may not have a second top recess step, with a substrate segment separating the first and second plated through hole vias. A top passive device recess may be formed, including the first top recess step, the second top recess step, and a top recess portion of the substrate segment, in the core layer. An embedded first top passive device with a first end portion and a second end portion is positioned in the top passive device recess.

In an additional aspect, the first plated through hole via further may include a first bottom recess step and the second plated through hole via further may or may not include a second bottom recess step. A bottom passive device recess may be formed, including the first bottom recess step, the second bottom recess step, and a bottom recess portion of the substrate segment, in the core layer. An embedded first bottom passive device with a first end portion and a second end portion is positioned in the bottom passive device recess.

In a further aspect, the present semiconductor package includes a top metallization layer with a first top contact pad and a second top contact pad on the top surface of the core layer. The first top contact pad is positioned overlapping and coupled to the first plated through hole via and overlapping and coupled to the first end portion of the top passive device, and the second top contact pad is positioned overlapping and coupled to the second plated through hole via and overlapping and coupled the second end portion of the top passive device.

In addition, the present semiconductor package includes a bottom metallization layer with a first bottom contact pad and a second bottom contact pad on the bottom surface of the core layer. The first bottom contact pad is positioned overlapping and coupled to the first plated through hole via and overlapping and coupled to the first end portion of the bottom passive device, and the second bottom contact pad is positioned overlapping and coupled to the second plated through hole via and overlapping and coupled the second end portion of the bottom passive device.

Figure 4A:
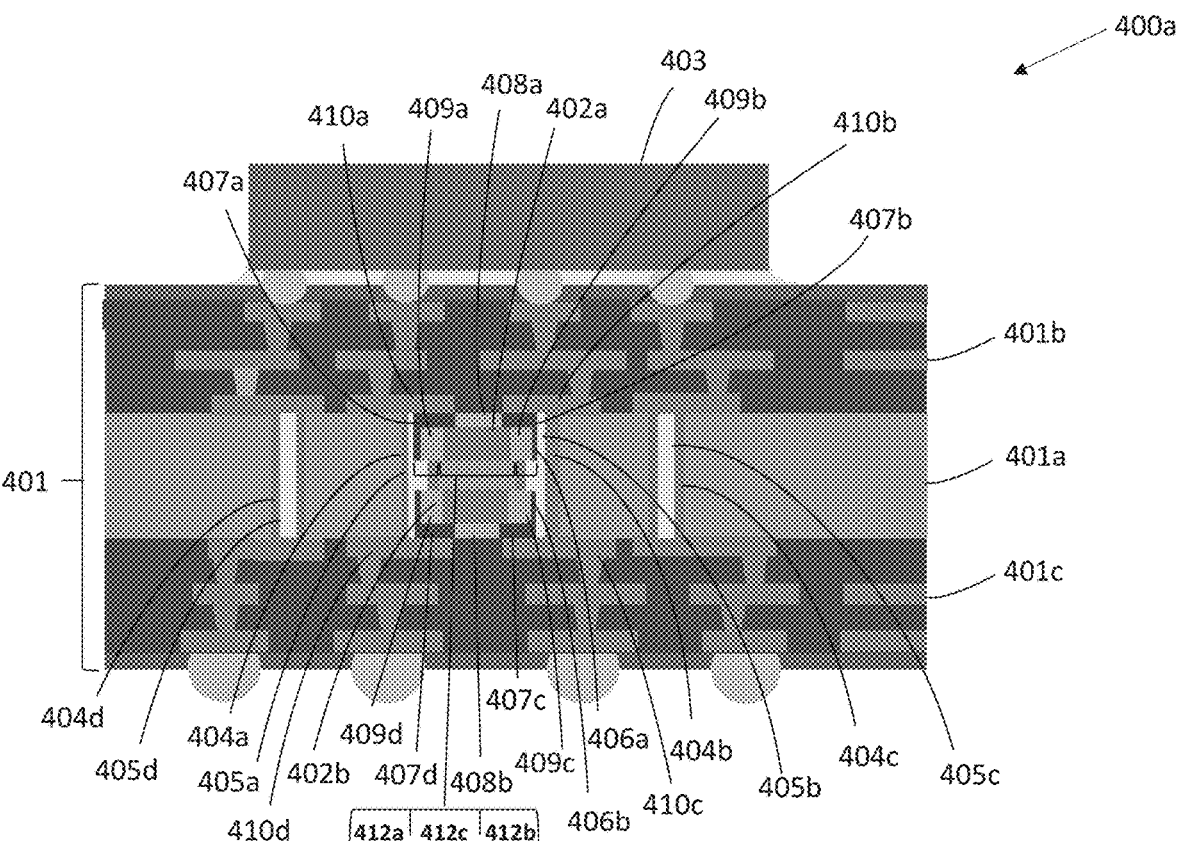
FIGS. 4A and 4B show cross-section views of present semiconductor packages with embedded passive devices according to aspects of the present disclosure.
Figure 4B:
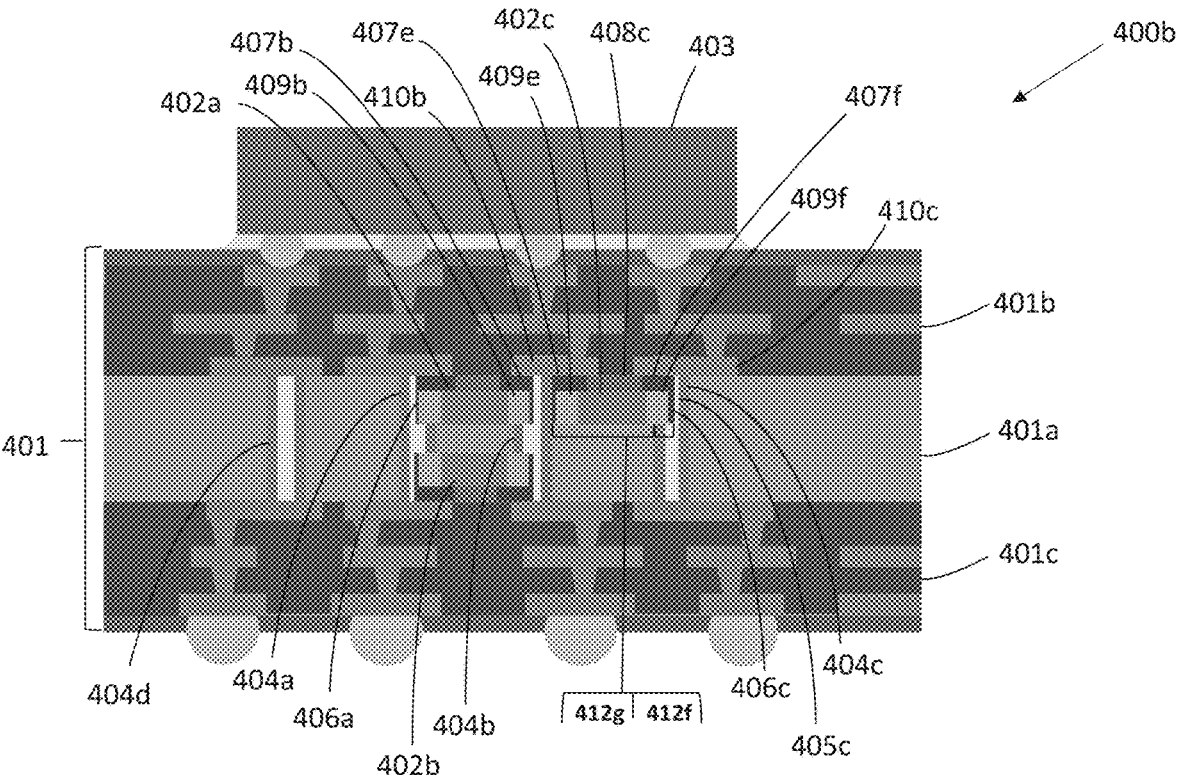

According to aspects of the present disclosure, FIGS. 4A and 4B show cross-section views of present semiconductor packages 400a and 400b with a plurality of embedded passive devices. These representative layouts, as well as for the following layout drawings, provide the approximate footprints for the various selected features of the present semiconductor packages and their relative positions in the semiconductor packages, which may be situated on different levels thereof.

In FIG. 4A, the semiconductor package 400a may have a semiconductor package substrate 401 with a core layer 401a with a top metallization layer 401b and a bottom metallization layer 401c. In this aspect, the semiconductor packages 400a may have an embedded top passive device 402a in a top passive device recess 406a, and an embedded bottom passive device 402b in a bottom passive device recess 406b. A silicon device 403 (e.g., a CPU, GPU, platform controller hub chipset, and/or other processor devices) may be coupled to the top metallization layer 401b, in accordance with the present disclosure.

In an aspect, the package substrate 401 may include one or more core layer 401a for providing improved mechanical performance, i.e., high rigidity for improved package substrate warpage control. In a further aspect, the core layer 401a may be made of glass cloth and resin layers. In another aspect, the package substrate 401 may be a coreless substrate (not shown). A coreless package substrate has no core layer and may provide a further miniaturized form-factor and improved electrical performance from reduced package stack-up geometry, minimized impedance discontinuities, and reduced signal return losses, and a passive device recess may be formed in such coreless package substrate.

According to the present disclosure, a substrate core layer of the present disclosure may be formed from organic-based materials (e.g., epoxy resins, polyester resin, vinyl ester, polyimide and/or ceramic polymer layer), from inorganic synthetic polymer materials (e.g., silicone or polysiloxane materials) or from semiconductor materials (e.g., silicon or glass substrate materials). In a particular aspect, the substrate core layer may be made of a bismaleimide triazine (BT) epoxy layer with reinforced fiber glasses.

In another aspect, the core layer 401a may include a plurality of plated through hole (PTH) vias, including, for example, PTH vias 404a, 404b, 404c, and 404d, as shown in FIG. 4A. In addition, the PTH vias 404a, 404b, 404c, and 404d may have non-conductive central columns/plugging layers 405a, 405b, 405c, and 405d, respectively, which may be made of a suitable dielectric material, e.g., an epoxy polymer resin, a polyimide or a polysiloxane layer and provide reinforcement and stability for the PTH vias. In this aspect, the PTH vias 404a, 404b, 404c, and 404d may have a conductive periphery surrounding a non-conductive central column. In some aspects, the plurality of PTH vias may include PTH vias that are fully made of a conductive material (e.g., copper) and without the use of non-conductive central columns/plugging layers (not shown).

In yet another aspect, as shown in FIG. 4A, the PTH via 404a, which may be a first PTH via, may have a first top recess step 412a and a first bottom recess step (not labeled), and the PTH via 404b, which may be a second PTH via, may have a second top recess step 412b and a second bottom recess step (not labeled). As shown in FIG. 4A, the embedded top passive device 402a may be positioned between the first and second PTH vias 404a and 404b in the top passive device recess 406a (i.e., over the first top recess step 412a and second top recess step 412b and a top recess portion of a substrate segment 412c there between), and similarly arranged, the embedded bottom passive device 402b may be positioned between the PTH vias 404a and 404b in the bottom passive device recess 406b (i.e., under the first bottom recess step (not labeled) and second bottom recess step (not labeled) and a bottom recess portion of a substrate segment (not labeled) there between).

In this aspect, the use of recess steps in the first and second PTH vias 404a and 404b may provide a significant reduction in the pitch between these PTH vias, as the embedded top and bottom passive devices 406a and 406b may be positioned to "encroach" onto the PTH vias' footprint. On the other hand, the recess steps in the PTH vias may be also be viewed as "accommodating" the embedded passive devices. While FIG. 4A shows encroachment by the embedded top and bottom passive devices 402a and 402b into both of the first and second PTH via 404a and 404b (i.e., each passive device recess having top and bottom recess steps), it is within the scope of the present disclosure to have encroachment into only one PTH via (i.e., each passive device recess having only one recess step). If pitch reduction is needed, the amount that a passive device encroaches into a PTH via may be in a range of approximately 10 to 80 percent, as measure by a PTH via's area.

In a further aspect, the first PTH via 404a may have a first diameter that is equal to or greater than a second diameter of the second PTH via 404b, with the first diameter in a range of approximately 100 to 400 µm) and the second diameter in a range of approximately 100 to 300 µm) extending through the core layer. In this aspect, the first PTH may be associated with a power supply voltage and the second plated through hole via is associated with a ground reference voltage.

In a further aspect, the embedded top passive device 402a may be a multiple-layer ceramic decoupling capacitor, a silicon capacitor, an inductor or a resistor and may be surrounded/embedded by top solder material portions 407a and 407b, which are separated by a dry film resist layer 408a, and similarly, the embedded bottom passive device 402b may be surrounded/embedded by bottom solder material portions 407c and 407d, which are separated by a dry film resist layer 408b.

In an aspect, the embedded top passive device 402a may have a first end portion 409a and a second end portion 409b, and similarly, the embedded bottom passive device 402b may have first and second end portions 409d and 409c, respectively. With respect to a first and second end portions for a passive device, each first and second end portion may have one or more contact terminals (not shown) for the passive device, which may be coupled to a surrounding solder material (e.g., solder material portions 407a, 407b, 407c, and 407d).

In a further aspect, as shown in FIG. 4A, the top metallization layer 401b may have a first top contact pad 410a and a second top contact pad 410b. The first top contact pad 410a is positioned overlapping and coupled to solder material portion 407a over the first end portion 409a of the embedded top passive device 402a, as well as being coupled to the first PTH via 404a. The second top contact pad 410b is positioned overlapping and coupled to solder material portion 407b over the second end portion 409b of the embedded top passive device 402a, as well as being coupled to the second PTH via 404b.

In yet a further aspect, as shown in FIG. 4A, the bottom metallization layer 401c may have a first bottom contact pad 410d and a second bottom contact pad 410c. The first bottom contact pad 410d is positioned overlapping and coupled to solder material portion 407d on the first bottom end portion 409d of the embedded bottom passive device 402b, as well as being coupled to the first PTH via 404a. The second bottom contact pad 410c is positioned overlapping and coupled to solder material portion 407c on the second end portion 409c of the embedded bottom passive device 402b, as well as being coupled to the second PTH via 404b.

Figure 5A:
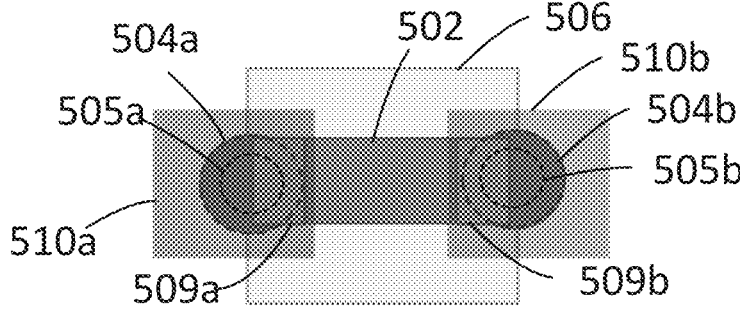
FIGS. 5A through 5D show top view layouts of passive devices positioned in their recesses according to aspects of the present disclosure.
Figure 5B:
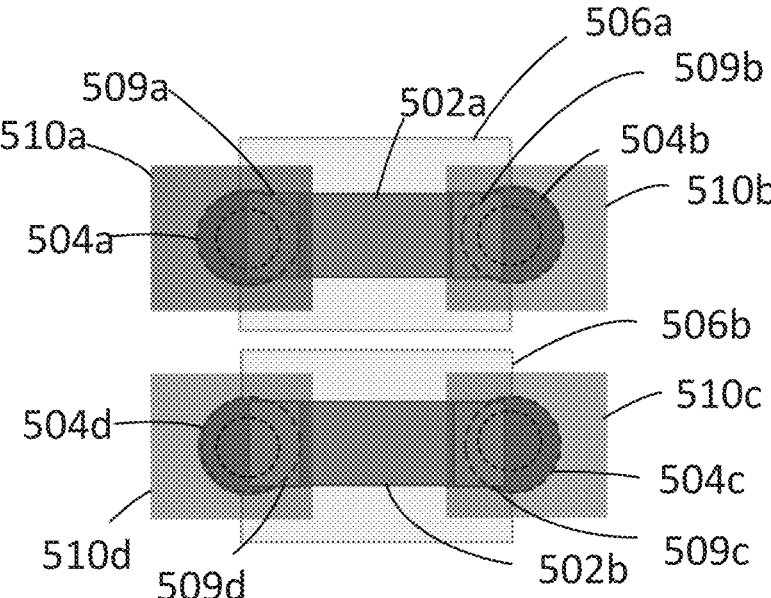
Figure 5C:
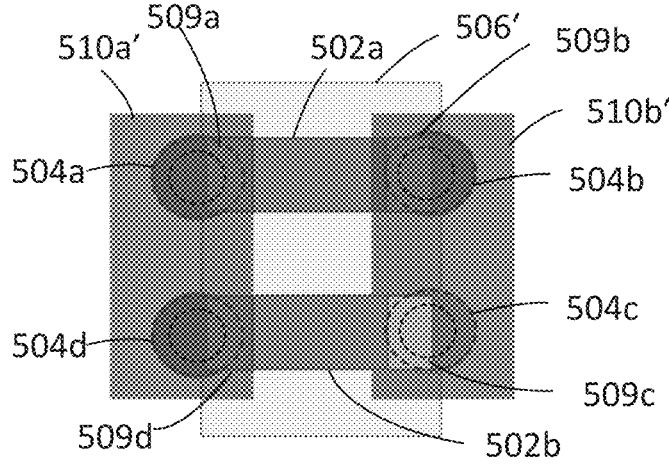

It should be understood that the embedded top passive device 402a may be representative of an array of embedded top passive devices positioned between a plurality of PTH vias, for example, as shown in FIGS. 5B and 5C, and the embedded bottom passive device 402b may be representative of an array of embedded bottom passive devices positioned between the plurality of PTH vias under the embedded top passives devices. In addition, an array of embedded passive devices may include passive devices in separate rows that "share" PTH vias between them, as shown in FIG. 4B.

In an aspect shown in FIG. 4B, the semiconductor package 400b, which may have similar features to semiconductor package 400a, may have a semiconductor package substrate 401 with a core layer 401a with a top metallization layer 401b and a bottom metallization layer 401c. In this aspect, the semiconductor packages 400b may include an embedded top passive device 402a, which may be an embedded first top passive device, in a top passive device recess 406a, which may be an embedded first top passive device recess, and an embedded second top passive device 402c in a second top passive device recess 406c, as well as a bottom passive device 402b. A silicon device 403 (e.g., a CPU, GPU, platform controller hub chipset, and/or other processor devices) may be coupled to the top metallization layer 401b, in accordance with the present disclosure.

In another aspect, the core layer 401a may include a plurality of plated through hole (PTH) vias, including, for example, PTH vias 404a, 404b, 404c, and 404d, as shown in FIG. 4B. In particular, the PTH via 404c, which may be a third PTH via, may have a non-conductive central column/plugging layer 405c, which may be made of a suitable dielectric material. In some aspects, the plurality of PTH vias may include PTH vias that are fully made of a conductive material (e.g., copper) and without the use of non-conductive central columns/plugging layers (not shown).

As shown in FIG. 4B, the second embedded top passive device 402c may be positioned between the second and third PTH vias 404b and 404c, respectively, in the second top passive device recess 406c (i.e., over top recess step 412f and a top recess portion of a substrate segment 412g). It is within the scope of the present disclosure to place a passive device between other PTH vias, including between PTH vias 404d and 404a (not shown). In an aspect, the first embedded top passive device 402a and the second embedded top passive device 402c may have central axes generally positioned in alignment on a same or adjacent horizontal and/or vertical planes.

In an aspect, the embedded second top passive device 402c may have first and second end portions 409e and 409f, respectively, with each end portion may have one or more contact terminals (not shown), which may be surrounded/embedded by top solder material portions 407e and 407f, which are separated by a dry film resist layer 408c, In another aspect, as shown in FIG. 4B, the third PTH via 404c may have a top recess step 412f, while the second PTH via 404b may not have a second top recess step. It is within the scope of the present disclosure to include a second top recess step for the second PTH via 404b when the pitch between the second and third PTH vias 404b and 404c may need to be reduced. In addition, it is within the scope of the present disclosure to not include any top recess step in either the second or third PTH vias 404b and 404c, respectively, when the pitch between the second and third PTH vias 404b and 404c may need not be reduced and the embedded second top passive devices 402c may be positioned not to encroach onto the PTH vias' footprints.

In a further aspect, as shown in FIG. 4B, the top metallization layer 401b may have a second top contact pad 410b and a third top contact pad 410c. The second top contact pad 410b may be positioned overlapping and coupled to solder material portion 407b over the second end portion 409b of the embedded first top passive device 402a and solder material portion 407e over the first end portion 409e of the embedded second top passive device 402c, as well as being coupled to the second PTH via 404b. The third top contact pad 410c may be positioned overlapping and coupled to solder material portion 407f over the second end portion 409f of the embedded second top passive device 402c, as well as being coupled to the PTH via 404c.

FIGS. 5A through 5D show top view layouts of passive devices positioned in their recesses according to aspects of the present disclosure. As shown in FIG. 5A, an embedded passive device 502 may have a first end portion 509a and second end portion 509b and be positioned in a passive device recess 506. In this aspect, the first end portion 509a may encroach on a first PTH via 504a, which has a non-conductive central column/plugging layer 505a, and second end portion 509b may encroach on a second PTH via 504b, which has a non-conductive central column/plugging layer 505b. If pitch reduction is needed, the amount that a passive device encroaches into a PTH via may be in a range of approximately 10 to 80 percent, as measure by a PTH via's area. Also, in this aspect, a first contact pad 510a may overlap and be coupled with the first PTH via 504a and the first end portion 509a of the embedded passive device 502, and a second contact pad 510b may overlap and be coupled with the second PTH via 504b and the second end portion 509b of the embedded passive device 502.

In an aspect shown in FIG. 5B, an embedded first passive device 502a may be positioned in a first passive device recess 506a, and an embedded second passive device 502b may be positioned in a second passive device recess 506b. In this aspect, the embedded first passive device 502a and embedded second passive device 502b may have central axes that may be generally positioned in alignment parallel to each other on the same or adjacent horizontal planes. It is within the scope of the present disclosure for the embedded first passive device 502a and embedded second passive device 502b to be representative of an array of passive devices that may be positioned in individual passive device recesses.

Also, in this aspect, a first contact pad 510a may overlap and be coupled with the first PTH via 504a and a first end portion 509a of the embedded passive device 502a, and a second contact pad 510b may overlap and be coupled with the second PTH via 504b and a second end portion 509b of the embedded passive device 502a. In addition, a third contact pad 510c may overlap and be coupled with a third PTH via 504c, which may be adjacent to the second PTH via 504b, and the second end portion 509c of the embedded passive device 502b, and a fourth contact pad 510d may overlap, and be coupled with a fourth PTH via 504d, which may be adjacent to the first PTH via 504a, and the first end portion 509d of the embedded passive device 502b. It should be understood that the embedded first passive device 502a and embedded second passive device 502b may be used independently from the other by virtue of their separated configurations.

In another aspect shown in FIG. 5C, an embedded first passive device 502a, and an embedded second passive device 502b may be positioned in a single passive device recess 506'. In this aspect, the embedded first passive device 502a and embedded second passive device 502b may have central axes that may be generally positioned in alignment parallel to each other on the same horizontal plane. It is within the scope of the present disclosure for the embedded first passive device 502a and embedded second passive device 502b to be representative of an array of passive devices positioned a single passive device recess.

Also, in this aspect, a first contact pad 510a' may overlap and be coupled with the first PTH via 504a and a first end portion 509a of the embedded first passive device 502a, as well as overlap and be coupled with the fourth PTH via 504d and a first end portion 509d of the embedded passive device 502b. In addition, a second contact pad 510b' may overlap and be coupled with a second PTH via 504b and the second end portion 509b of the embedded passive device 502a, as well as overlap and be coupled with a third PTH via 504c and the second end portion 509c of the embedded second passive device 502b. It should be understood that the embedded first passive device 502a and embedded second passive device 502b may be used together by virtue of their joined configuration.

Figure 5D:
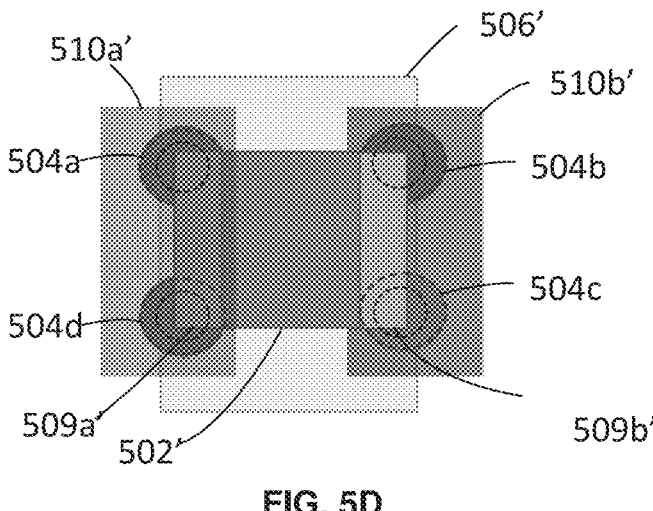

In a further aspect shown in FIG. 5D, an embedded large passive device 502' may be positioned in a single passive device recess 506'. In this aspect, a first contact pad 510a' may overlap and be coupled with a first PTH via 504a and a fourth PTH via 504d, as well as a first end portion 509a' of the embedded large passive device 502', which may overlap and be coupled with the first PTH via 504a and the fourth PTH via 504d. In addition, a second contact pad 510b' may overlap and be coupled with a second PTH via 504b and a third PTH via 504c, as well as a second end portion 509b' of the embedded large passive device 502', which may overlap and be coupled with the second PTH via 504b and the third PTH via 504c. It is within the scope of the present disclosure for the embedded large passive device 502' to be coupled with a plurality of PTH vias and be representative of an array of large passive devices positioned a single passive device recess.

In an aspect, the first PTH via 504a and the fourth PTH via 504d may be vertically aligned, and the second PTH via 504b and the third PTH via 504c may be vertically aligned, as shown in FIG. 5B through 5D. It should be understood that, from among the plurality of PTH vias, there may be additional PTH vias that are vertically aligned with the first PTH via 504a and the second PTH via 504b.

In yet a further aspect, the contact pads may have a rectangular shape, as shown in FIGS. 5A to 5D, or a circular/oval shape (not shown). In accordance with the present disclosure, a contact pad may have a width/diameter in the range of approximately 300 μm to 500 μm.

According to aspects of the present disclosure, to obtain the aforementioned technical advantages, methods are provided for making the present semiconductor packages include providing a package substrate and forming a plurality of plated through hole vias in the package substrate. The plurality of plated through hole vias may include a first plated through hole via and a second plated through hole via that are separated by a substrate segment. A top passive device recess may be formed by removing portions of the first plated through hole via to form a first top recess step, the second plated through hole via to form a second top recess step, and the substrate segment to form a top recess portion from a top surface of the package substrate.

The further steps include positioning a first end portion of a top passive device in the first top recess step of the first plated through hole via and a second end portion of the top passive device in the second top recess step of the second plated through hole via, forming a top metallization layer comprising a first top contact pad and a second top contact pad, for which the first top contact pad overlaps and is coupled to the first plated through hole via and the first end portion of the top passive device, and the second contact pad overlaps and is coupled to the second plated through hole via and the second end portion of the top passive device.

In a further aspect of the method, additional steps include forming a bottom passive device recess in a bottom surface of the package substrate by removing portions of the first plated through hole via to form a first bottom recess step, the second plated through hole via to form a second bottom recess step and the substrate segment to form a bottom recess portion. The additional steps include positioning a first end portion of a bottom passive device in the first bottom recess step of the first plated through hole via and a second end portion of the bottom passive device in the second recess step of the second plated through hole via and forming a bottom metallization layer including a first bottom contact pad and a second bottom contact pad, for which the first bottom contact pad overlaps and is coupled to the first plated through hole via and the first end portion of the bottom passive device, and the second bottom contact pad overlaps and is coupled to the second plated through hole via and the second end portion of the bottom passive device.

To more readily understand and put into practical effect the method of forming the present semiconductor package and package substrate, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIGS. 6A through 6K and 6D' through 6K' show cross-sectional views of present semiconductor packages with embedded passive devices at different stages for exemplary process flows for making such semiconductor packages according to aspects of the present disclosure.

Figure 6A:
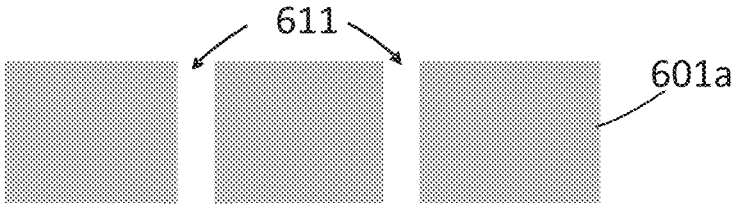

In FIG. 6A, according to a further aspect in forming a semiconductor package, openings 611 are formed in a substrate core layer 601a. The openings 611 may be formed by a laser or mechanical drilling, and/or etching processing step that removes portions of the substrate core layer 601a. The openings 611 provide spaces for a plurality of plated through hole (PTH) vias according to the present disclosure.

Figure 6B:
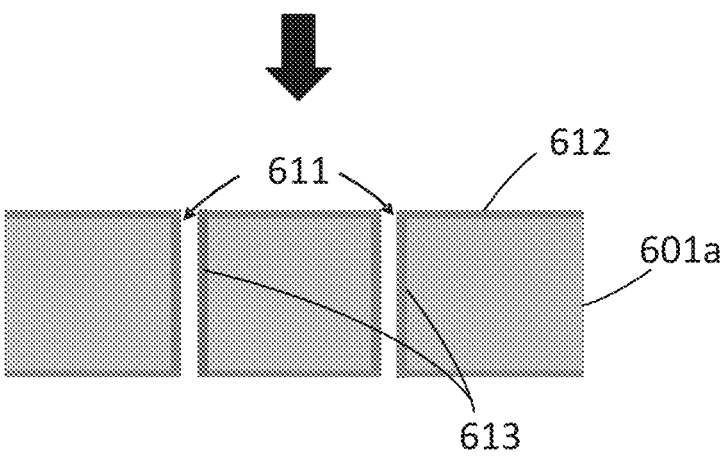

In FIG. 6B, according to a further aspect in forming a semiconductor package, a layer of conductive material 612 may be plated or formed on the substrate core layer 601a together with a layer of conductive material 613 being plated or formed in openings 611. The layer of conductive material may be formed using an electroless and/or an electrolytic plating process to cover exposed surfaces. The layers of a conductive material 612 and 613 may be made of copper. In an alternative aspect, some or all of the openings 611 may be completely filled with conductive material.

According to the present disclosure, the choice between an electroless and electrolytic process may be based on the electroless process not requiring the application of an external electrical current to drive the deposition, whereas the electrolytic process does. In addition, an electroless process uses a chemical reducing agent within its solution chemistry which will result in nearly uniform deposition on all surfaces that are wetted by the chemistry.

Figure 6C:
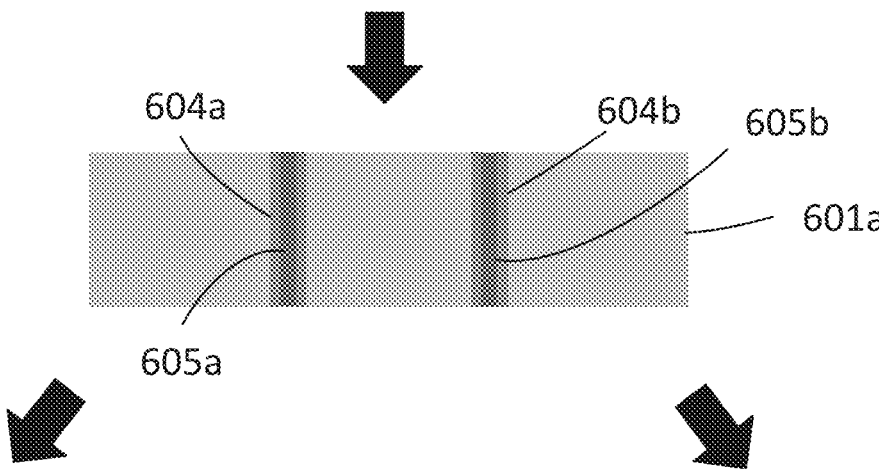

In FIG. 6C, according to a further aspect in forming a semiconductor package, the openings 611 may be further filled with a dielectric material to form non-conductive central columns/plugging layers 605a and 605b of PTH vias 604a and 604b, respectively. The non-conductive central columns/plugging layers 605a and 605b may be formed by a conventional deposition process. As shown in FIG. 6C, the layer of conductive material 612 may be removed by a conventional mechanical grinding/polish, along with any excess dielectric material, from the top and bottom surfaces of the core layer 601a.

In FIGS. 6D and 6D', according to a further aspect in forming a semiconductor package, a process step of laser or mechanical drilling may be used to remove portions of the PTH vias and the non-conductive central columns/plugging layers, as well as portions of the substrate segment there between, to form passive device recesses 606a, 606b and 606'. As shown in FIG. 6D, a top passive device recess 606a includes a first top recess step 612a and a second top recess step 612b and a top recess portion of a substrate segment 612c there between, and similarly shown in FIG. 6D', a top passive device recess 606' includes a first top recess step 612a' and a second top recess step 612b' and a top recess portion of a substrate segment 612c' there between. In an aspect, a bottom passive device recess 606b may be formed by inverting the core layer 601a before performing a second process step of laser or mechanical drilling.

In FIGS. 6E and 6E', according to a further aspect in forming a semiconductor package, a process step of positioning a passive device in a passive device recess is shown therein. As shown in FIG. 6E, a top passive device 602a may be positioned in the top passive device recess 606a and may be attached using conventional methods, including solder bonding, thermal compression bonding, or other surface mounting methods. In another aspect, a bottom passive device 602b may be positioned in the bottom passive device recess 606b by inverting the core layer 601a and performing a second attachment process step of solder bonding, thermal compression bonding, or other surface mounting methods. As shown in FIG. 6E', a top passive device 602' may be positioned in the top passive device recess 606' and also may be attached using conventional methods, including solder bonding, thermal compression bonding, or other surface mounting methods.

In FIGS. 6F and 6F', according to a further aspect in forming a semiconductor package, a dry resist film may be placed over the passive device and filling the passive device recess as shown therein. In an aspect shown in FIG. 6F, the dry resist film 608a may be formed over the top passive device 602a and the top surface of the core layer 601a, and the dry resist film 608b may be formed over the bottom passive device 602b and the bottom surface of the core layer 601a, both using conventional deposition and/or lamination process steps. Similarly, in FIG. 6F', the dry resist film 608' may be formed over the top passive device 602' and the top surface of the core layer 601a' using conventional deposition and/or lamination process steps.

In FIGS. 6G and 6G', according to a further aspect in forming a semiconductor package, the dry resist films may be patterned. In an aspect shown in FIG. 6G, a patterned dry resist film 608a may be formed over the top passive device 602a and a patterned dry resist film 608b may be formed over the bottom passive device 602b, as well as removing the dry resist film from the passive device recesses 606a and 606b. In particular, by selectively removing portions of the dry resist film, recess openings 606a-i and 606a-ii may be formed at the top surface of core layer 601a and recess openings 606*b*-*i* and 606*b*-*ii* may be formed at the bottom surface of core layer 601*a* using conventional wet etching process steps. Similarly, in FIG. 6G', a patterned dry resist film 608' may be formed over the top passive device 602' by selectively removing portions of the dry resist film to form recess openings 606*a*-*i'* and 606*a*-*ii'* using conventional wet etching process steps. It is also possible to use reactive ion etching to form the patterned dry resist films.

In FIGS. 6H, according to a further aspect in forming a semiconductor package, a solder material layer 607 may be formed over the top surface of the core layer 601*a* and the patterned dry resist film 608*a*, thereby filling passive device recess 606*a* to form solder material portions 607*a* and 607*b* and surrounding the top passive device 602*a*. In addition, a solder material layer 607-*i* may be formed over the bottom surface of the core layer 601*a* and the patterned dry resist film 608*b*, thereby filling passive device recess 606*b* to form solder material portions 607*c* and 607*d* and surrounding the bottom passive device 602*b*. Similarly, in FIG. 6H', a solder material layer 607' may be formed over the top surface of the core layer 601*a'* and the patterned dry resist film 608', thereby filling passive device recess 606' to form solder material portions 607*a'* and 607*b'* and surrounding the top passive device 602'. The solder material layers may be formed of a conductive material using an electroless and/or an electrolytic plating process to cover exposed surfaces. In an aspect, the solder material may be made of copper. In an aspect, the solder layer may be formed through e.g., a solder paste printing or a dispensing process. Thereafter, a conventional mechanical grinding/polish process may be used to remove any excess solder material from the top and bottom surfaces of the core layer 601*a*.

In FIGS. 6I and 6I', according to a further aspect in forming a semiconductor package, the formation of contact pads for the plated through hole (PTH) vias and the embedded passive devices are shown. In FIG. 6I, contact pads 610*a*, 610*b*, 6110*c*, and 610*d* may be formed by a series of commonly used deposition and patterning process steps. In this aspect, the contact pad 610*a* may be coupled with PTH via 604*a* and solder material portion 607*a*, and the contact pad 610*b* may be coupled with PTH via 604*b* and solder material portion 607*b*. Further to this aspect, the contact pad 610*c* may be coupled with PTH via 604*b* and solder material portion 607*c* and the contact pad 610*d* may be coupled with PTH via 604*a* and solder material portion 607*d*. Similarly, in FIG. 6I', contact pads 610*a'*, 610*b'*, 6110*c'*, and 610*d'* may be formed by a series of commonly used deposition and patterning process steps. In this aspect, the contact pad 610*a'* may be coupled with PTH via 604*a'* and solder material portion 607*a'*, and the contact pad 610*b'* may be coupled with PTH via 604*b'* and solder material portion 607*b'*.

In FIGS. 6J and 6J', according to a further aspect in forming a semiconductor package, metallization layers 601*b* and 601*c* may be formed on the top and bottom of the core layer 601*a*, respectively, and metallization layer 601*b'* and 601*c'* may be formed on the top and bottom of the core layer 601*a'*, respectively. The metallization layers may be formed by a series of commonly used deposition and patterning process steps, including a dielectric lamination process, a drilling process, an electroplating process, a photolithography process and/or an etching process.

In FIGS. 6K and 6K', according to a further aspect in forming a semiconductor package, a silicon device 603 may be surface mounted on semiconductor package substrate 601 to form a semiconductor package 600, as shown in FIG. 6K, and a silicon device 603' may be surface mounted on semiconductor package substrate 601' to form a semiconductor package 600' as shown in FIG. 6K'. The silicon dies may be coupled to one or more of the embedded passive devices through metal routings, vertical micro-vias, and the PTH vias. The methods for surface mounting that may be used, including solder reflow, thermal compression bonding, or other surface mounting methods.

The fabrication methods and the choice of materials presented above are intended to be exemplary for forming the present semiconductor packages. It will be apparent to those ordinary skilled practitioners that the foregoing process operations may be modified without departing from the spirit of the present disclosure.

FIG. 7 shows a simplified flow diagram for an exemplary method for making semiconductor packages with embedded passive devices according to an aspect of the present disclosure.

The operation 701 may be directed to providing a substrate with a plurality of plated through hole (PTH) vias.

The operation 702 may be directed to etching to form a passive device recess between a first and second PTH vias by forming a step recess in at least the first PTH via and a recess portion in the substrate.

The operation 703 may be directed to placing a passive device with first and second end portions in the passive device recess.

The operation 704 may be directed to placing a dry resist film over the passive device and etching openings over the first end portion and the second end portion.

The operation 705 may be directed to placing solder material in the openings over the first and second end portions.

The operation 706 may be directed to performing a metal layer buildup process to provide first and second contact pads and interconnects to couple the passive device to a processor device.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

Figure 8:
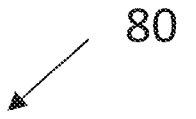
FIG. 8 shows an illustration of a computing device that includes a present semiconductor package according to a further aspect of the present disclosure.

Aspects of the present disclosure may be implemented into a computing device or system using any suitable hardware and/or software. FIG. 8 schematically illustrates a computing device 80 that may include a semiconductor package 800, as described hereinabove, in accordance with those aspects. According to the present disclosure, the computing device may include a printed circuit board or motherboard 801, a semiconductor package 800 with a substrate having embedded passive devices between plated through hole vias that accommodate the embedded passive devices.

In another aspect, the computing device 80 may house a board such as a motherboard 801. The motherboard 801 may include a number of components, including, but not limited to, a semiconductor package 800 and at least one communication chip 802. The semiconductor package according to the present disclosure, may be physically and electrically coupled to the motherboard 801. In some implementations, the at least one communication chip 802 may also be physically and electrically coupled to the motherboard 801. In further implementations, the communication chip 802 may be part of a semiconductor package.

Depending on its applications, computing device 80 may include other components that may or may not be physically and electrically coupled to the motherboard 801. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 800 of the computing device 80 may include a package substrate having embedded passive devices, as described herein.

The communication chip 802 may enable wireless communications for the transfer of data to and from the computing device 80. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 802 may implement any of a number of wireless standards or protocols, including but not limited to Institute for Electrical and Electronics Engineers (IEEE) standards including Wi-Fi (IEEE 802.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 802 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 802 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 802 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 802 may operate in accordance with other wireless protocols in other aspects.

The computing device 80 may include a plurality of communication chips 802. For instance, a first communication chip 802 may be dedicated to shorter range wireless communications such as Wi-Fi and Bluetooth and a second communication chip 802 may be dedicated to longer range wireless communications such as GPS, EDGE, GPRS, CDMA, WiMAX, LTE, Ev-DO, and others.

In various implementations, the computing device 80 may be a laptop, a netbook, a notebook, an ultra book, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 80 may be a mobile computing device. In further implementations, the computing device 80 may be any other electronic device that processes data.

To more readily understand and put into practical effect the present measurement tool and methods, particular aspects will now be described by way of examples. For the sake of brevity, duplicate descriptions of features and properties may be omitted.

EXAMPLES

Example 1 provides a semiconductor package substrate including a plurality of plated through hole vias including a first plated through hole via and a second plated through hole via, the first plated through hole via including a first top recess step, a substrate segment, for which the substrate segment separates the first and second plated through hole vias, and a top passive device recess including the first recess step and a top recess portion of the substrate segment, for which the top passive device recess is positioned between the first plated through hole via and the second plated through hole via.

Example 2 may include the semiconductor package substrate of example 1 and/or any other example disclosed herein, further including the second plated through hole via including a second top recess step and the top passive device recess further including the second top recess step.

Example 3 may include the semiconductor package substrate of example 1 and/or any other example disclosed herein, further including a core layer, for which the top passive device recess is positioned in the core layer.

Example 4 may include the semiconductor package substrate of example 1 and/or any other example disclosed herein, further including a top metallization layer including a first top contact pad and a second top contact pad, for which the first top contact pad is positioned overlapping and coupled to a first end portion of a passive device positioned in the top passive device recess and the second contact pad is positioned overlapping and coupled to a second end portion of the passive device.

Example 5 may include the semiconductor package substrate of example 4 and/or any other example disclosed herein, for which the first top contact pad is positioned overlapping and coupled to the first plated through hole via and the second top contact pad is positioned overlapping and coupled to the second plated through hole via.

Example 6 may include the semiconductor package substrate of example 2 and/or any other example disclosed herein, for which the first plated through hole via further includes a first bottom recess step and the second plated through hole via further includes a second bottom recess step, and a bottom passive device recess including the first bottom recess step, the second bottom recess step, and a bottom recess portion of the substrate segment.

Example 7 may include the semiconductor package substrate of example 6 and/or any other example disclosed herein, further including a bottom metallization layer including a first bottom contact pad and a second bottom contact pad, for which the first bottom contact pad is positioned overlapping and coupled to a first end portion of a bottom passive device positioned in the bottom passive device recess and the second bottom contact pad is positioned overlapping and coupled a second end portion of the bottom passive device.

Example 8 may include the semiconductor package substrate of example 7 and/or any other example disclosed herein, for which the first bottom contact pad is positioned overlapping and coupled to the first plated through hole via and the second bottom contact pad is positioned overlapping and coupled to the second plated through hole via.

Example 9 may include the semiconductor package substrate of example 1 and/or any other example disclosed herein, further including the first plated through hole via including a first conductive periphery surrounding a first non-conductive central column and the second plated through hole via including a second conductive periphery surrounding a second non-conductive central column.

Example 10 may include the semiconductor package substrate of example 1 and/or any other example disclosed herein, further including the first plated through hole via having a greater diameter than the second plated through hole via, for which the first plated through hole via is associated with a power supply voltage and the second plated through hole via is associated with a ground reference voltage.

Example 11 may include the semiconductor package substrate of example 2 and/or any other example disclosed herein, for which the plurality of plated through hole vias further includes a first adjacent plated through hole via adjacent and vertically aligned with the first plated through hole via and a second adjacent plated through hole via adjacent and vertically aligned with the second plated through hole via, for which the substrate segment separates the first and second adjacent plated through hole vias, the first adjacent plated through hole via including a first adjacent top recess step, the second adjacent plated through hole via including a second adjacent top recess step, and an adjacent passive device recess including the first adjacent top recess step, an adjacent recess portion in the substrate segment, and the second adjacent top recess step.

Example 12 may include the semiconductor package substrate of example 11 and/or any other example disclosed herein, further including a metallization layer including a first adjacent contact pad and a second adjacent contact pad, for which the first adjacent contact pad is positioned overlapping and coupled to a first end portion of an adjacent passive device positioned in the adjacent passive device recess and the second adjacent contact pad is positioned overlapping and coupled a second end portion of the adjacent passive device positioned in the adjacent passive device recess.

Example 13 may include the semiconductor package substrate of example 11 and/or any other example disclosed herein, further including a metallization layer including a first contact pad and a second contact pad, for which the first contact pad is positioned overlapping and coupled to a first end portion of a first top passive device positioned in the top passive device recess and the second contact pad is positioned overlapping and coupled a second end portion of the first top passive device, and for which the first contact pad is positioned overlapping and coupled to a first end portion of a second top passive device positioned in the top adjacent passive device recess and the second contact pad is positioned overlapping and coupled a second end portion of the second top passive device.

Example 14 may include the semiconductor package substrate of example 11 and/or any other example disclosed herein, for which the top passive device recess and the adjacent passive device recess are adjoined and form a contiguous recess for a passive device step, and a metallization layer including a first contact pad and a second contact pad, for which the first contact pad is positioned overlapping and coupled to a first end portion of a passive device positioned in the adjoined first top passive device recess and the adjacent passive device recess, and the second contact pad is positioned overlapping and coupled a second end portion of the passive device.

Example 15 provides a semiconductor package including a semiconductor device positioned over a semiconductor substrate, the semiconductor substrate including a core layer with a top and bottom surface and a plurality of plated through hole vias, the plurality of plated through hole vias including a first plated through hole via and a second plated through hole via, the first plated through hole including a first top recess step, the second plated through hole via including a second top recess step, a substrate segment separating the first and second plated through hole vias, a top passive device recess including the first recess step, the second recess step, and recess portion of the substrate segment, for which the top passive device recess is positioned in the core layer, and an embedded first top passive device with a first end portion and a second end portion, for which the top passive device is positioned in the top passive device recess.

Example 16 may include the semiconductor package of example 15 and/or any other example disclosed herein, for which the first plated through hole via further includes a first bottom recess step and the second plated through hole via further includes a second bottom recess step, and a bottom passive device recess including the first bottom recess step, the second bottom recess step, and a bottom recess portion of the substrate segment, for which the bottom passive device recess is positioned in the core layer, and a bottom passive device with a first end portion and a second end portion, for which the bottom passive device is positioned in the bottom passive device recess.

Example 17 may include the semiconductor package of example 15 and/or any other example disclosed herein, further including a top metallization layer on the top surface of the core layer, for which the top metallization layer includes a first top contact pad and a second top contact pad, for which the first top contact pad is positioned overlapping and coupled to the first plated through hole via and overlapping and coupled to the first end portion of the top passive device and the second contact pad is positioned overlapping and coupled to the second plated through hole via and overlapping and coupled the second end portion of the top passive device, and a bottom metallization layer on the bottom surface of the core layer, for which the bottom metallization layer includes a first bottom contact pad and a second bottom contact pad, for which the first bottom contact pad is positioned overlapping and coupled to the first plated through hole via and overlapping and coupled to the first end portion of the bottom passive device and the second bottom contact pad is positioned overlapping and coupled to the second plated through hole via and overlapping and coupled the second end portion of the bottom passive device.

Example 18 may include the semiconductor package of example 15 and/or any other example disclosed herein, for which the plurality of plated through hole vias further including a third plated through hole via spaced apart from the first plated through hole via and the second plated through hole via, and an embedded second top passive device position between the third plated through hole via and first plated through hole via or the second plated through hole via, for which a central axis of the embedded first top passive device and a central axis of the embedded second top passive device are positioned in alignment on a same or adjacent horizontal and/or vertical planes.

Example 19 provides a method including the steps of providing a package substrate and forming a plurality of plated through hole vias in the package substrate, the plurality of plated through hole vias includes a first plated through hole via and a second plated through hole via, for which the first and second plated through hole vias are separated by a substrate segment, forming a top passive device recess in a top surface of the package substrate by removing portions of the first plated through hole via to form a first top recess step, the second plated through hole via to form a second top recess step, and the substrate segment to form a top recess portion, positioning a first end portion of a top passive device in the first top recess step of the first plated through hole via and a second end portion of the top passive device in the second top recess step of the second plated through hole via, forming a top metallization layer including a first top contact pad and a second top contact pad, for which the first top contact pad overlaps and is coupled to the first plated through hole via and the first end portion of the top passive device, and the second contact pad overlaps and is coupled to the second plated through hole via and the second end portion of the top passive device.

Example 20 may include the method of example 19 and/or any other example disclosed herein, further including the steps of forming a bottom passive device recess in a bottom surface of the package substrate by removing portions of the first plated through hole via to form a first bottom recess step, the second plated through hole via to form a second bottom recess step and the substrate segment to form a bottom recess portion, positioning a first end portion of a bottom passive device in the first bottom recess step of the first plated through hole via and a second end portion of the bottom passive device in the second recess step of the second plated through hole via, forming a bottom metallization layer including a first bottom contact pad and a second bottom contact pad, for which the first bottom contact pad overlaps and is coupled to the first plated through hole via and the first end portion of the bottom passive device, and the second bottom contact pad overlaps and is coupled to the second plated through hole via and the second end portion of the bottom passive device.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package substrate comprising:
a core layer positioned between a top metallization layer and a bottom metallization layer;
a plurality of plated through hole vias comprising a first plated through hole via and a second plated through hole via;
the first plated through hole via comprising a first top recess step;
a substrate segment, wherein the substrate segment separates the first and second plated through hole vias; and
a top passive device recess comprising the first recess step and a top recess portion of the substrate segment, wherein the top passive device recess is positioned between the first plated through hole via and the second plated through hole via,
wherein a first passive device is positioned in the top passive device recess and a second passive device is positioned in a bottom passive device recess,
wherein the first passive device and the second passive device are disposed at least partially in the first plated through hole via and the second plated through hole via,
wherein the top passive device recess and the bottom passive device recess are positioned vertically above one another in the core layer.

2. The semiconductor package substrate of claim 1, wherein the second plated through hole via comprises a second top recess step and the top passive device recess further comprises the second top recess step.

3. The semiconductor package substrate of claim 1, further comprising a first top contact pad and a second top contact pad in the top metallization layer, wherein the first top contact pad is positioned overlapping and coupled to a first end portion of the first passive device positioned in the top passive device recess and the second contact pad is positioned overlapping and coupled to a second end portion of the first passive device.

4. The semiconductor package substrate of claim 3, wherein the first top contact pad is positioned overlapping and coupled to the first plated through hole via and the second top contact pad is positioned overlapping and coupled to the second plated through hole via.

5. The semiconductor package substrate of claim 2, wherein the first plated through hole via further comprises a first bottom recess step and the second plated through hole via further comprises a second bottom recess step, and wherein the bottom passive device recess comprises the first bottom recess step, the second bottom recess step, and a bottom recess portion of the substrate segment.

6. The semiconductor package substrate of claim 5, further comprising a bottom metallization layer comprising a first bottom contact pad and a second bottom contact pad, wherein the first bottom contact pad is positioned overlapping and coupled to a first end portion of a bottom passive device positioned in the bottom passive device recess and the second bottom contact pad is positioned overlapping and coupled to a second end portion of the bottom passive device.

7. The semiconductor package substrate of claim 6, wherein the first bottom contact pad is positioned overlapping and coupled to the first plated through hole via and the second bottom contact pad is positioned overlapping and coupled to the second plated through hole via.

8. The semiconductor package substrate of claim 1, wherein the first plated through hole via comprises a first conductive periphery surrounding a first non-conductive central column, and wherein the second plated through hole via comprises a second conductive periphery surrounding a second non-conductive central column.

9. The semiconductor package substrate of claim 1, wherein the first plated through hole via has a greater diameter than the second plated through hole via, and wherein the first plated through hole via is associated with a power supply voltage and the second plated through hole via is associated with a ground reference voltage.

10. The semiconductor package substrate of claim 2, wherein the plurality of plated through hole vias further comprises:

a first adjacent plated through hole via adjacent and vertically aligned with the first plated through hole via and a second adjacent plated through hole via adjacent and vertically aligned with the second plated through hole via, wherein the substrate segment separates the first and second adjacent plated through hole vias, wherein the first adjacent plated through hole via comprises a first adjacent top recess step, and wherein the second adjacent plated through hole via comprises a second adjacent top recess step; and an adjacent passive device recess comprising the first adjacent top recess step, an adjacent recess portion in the substrate segment, and the second adjacent top recess step.

11. The semiconductor package substrate of claim 10, further comprising a metallization layer comprising a first adjacent contact pad and a second adjacent contact pad, wherein the first adjacent contact pad is positioned overlapping and coupled to a first end portion of an adjacent passive device positioned in the adjacent passive device recess and the second adjacent contact pad is positioned overlapping and coupled to a second end portion of the adjacent passive device positioned in the adjacent passive device recess.

12. The semiconductor package substrate of claim 10, further comprising:

a metallization layer comprising a first contact pad and a second contact pad, wherein the first contact pad is positioned overlapping and coupled to a first end portion of a first top passive device positioned in the top passive device recess and the second contact pad is positioned overlapping and coupled to a second end portion of the first top passive device; and wherein the first contact pad is positioned overlapping and coupled to a first end portion of a second top passive device positioned in a top adjacent passive device recess and the second contact pad is positioned overlapping and coupled to a second end portion of the second top passive device.

13. The semiconductor package substrate of claim 10, wherein the top passive device recess and the adjacent passive device recess are adjoined and form a contiguous recess for a passive device step, and wherein a metallization layer comprises a first contact pad and a second contact pad, wherein the first contact pad is positioned overlapping and coupled to a first end portion of a passive device positioned in the adjoined first top passive device recess and the adjacent passive device recess, and wherein the second contact pad is positioned overlapping and coupled to a second end portion of the passive device.

14. A semiconductor package comprising:

a semiconductor device positioned over a semiconductor substrate, the semiconductor substrate comprising a core layer with a top and bottom surface and a plurality of plated through hole vias, the plurality of plated through hole vias comprising a first plated through hole via and a second plated through hole via, wherein the core layer is positioned between a top metallization layer and a bottom metallization layer, wherein the first plated through hole via comprises a first top recess step, wherein the second plated through hole via comprises a second top recess step, and wherein the first plated through hole via further comprises a first bottom recess step and the second plated through hole via further comprises a second bottom recess step;

a substrate segment separating the first and second plated through hole vias;

a top passive device recess comprising the first recess step, the second recess step, and recess portion of the substrate segment, wherein the top passive device recess is positioned in the core layer;

a bottom passive device recess comprising the first bottom recess step, the second bottom recess step, and a bottom recess portion of the substrate segment, wherein the bottom passive device recess is positioned in the core layer; and a bottom passive device with a first end portion and a second end portion, wherein the bottom passive device is positioned in the bottom passive device recess; and an embedded first top passive device with a first end portion and a second end portion, wherein the top passive device is positioned in the top passive device recess, wherein the top passive device is disposed at least partially in the first plated through hole via and the second plated through hole via, wherein the top passive device recess and the bottom passive device recess are positioned vertically above one another in the core layer.

15. The semiconductor package of claim 14 further comprising:

a first top contact pad and a second top contact pad in the top metallization layer, wherein the first top contact pad is positioned overlapping and coupled to the first plated through hole via and overlapping and coupled to the first end portion of the top passive device and the second contact pad is positioned overlapping and coupled to the second plated through hole via and overlapping and coupled the second end portion of the top passive device; and a first bottom contact pad and a second bottom contact pad in the bottom metallization layer, wherein the first bottom contact pad is positioned overlapping and coupled to the first plated through hole via and overlapping and coupled to the first end portion of a bottom passive device and the second bottom contact pad is positioned overlapping and coupled to the second plated through hole via and overlapping and coupled to the second end portion of the bottom passive device.

16. The semiconductor package of claim 14, wherein the plurality of plated through hole vias further comprise:

a third plated through hole via spaced apart from the first plated through hole via and the second plated through hole via; and an embedded second top passive device position between the third plated through hole via and first plated through hole via or the second plated through hole via, wherein a central axis of the embedded first top passive device and a central axis of the embedded second top passive device are positioned in alignment on a same or adjacent horizontal and/or vertical planes.

17. A method comprising:

providing a package substrate and forming a plurality of plated through hole vias in the package substrate, the plurality of plated through hole vias comprising a first plated through hole via and a second plated through hole via, wherein the first and second plated through hole vias are separated by a substrate segment;

forming a top passive device recess in a top surface of the package substrate by removing portions of the first plated through hole via to form a first top recess step, the second plated through hole via to form a second top recess step, and the substrate segment to form a top recess portion;

positioning a first end portion of a top passive device in the first top recess step of the first plated through hole via and a second end portion of the top passive device in the second top recess step of the second plated through hole via;

positioning the top passive device in the top passive device recess, wherein the top passive device is disposed at least partially in the first plated through hole via and the second plated through hole via; and forming a top metallization layer comprising a first top contact pad and a second top contact pad, wherein the first top contact pad overlaps and is coupled to the first plated through hole via and the first end portion of the top passive device, and the second contact pad overlaps and is coupled to the second plated through hole via and the second end portion of the top passive device, forming a bottom passive device recess in a bottom surface of the package substrate by removing portions of the first plated through hole via to form a first bottom recess step, the second plated through hole via to form a second bottom recess step and the substrate segment to form a bottom recess portion;

positioning a first end portion of a bottom passive device in the first bottom recess step of the first plated through hole via and a second end portion of the bottom passive device in the second recess step of the second plated through hole via; and forming a bottom metallization layer comprising a first bottom contact pad and a second bottom contact pad, wherein the first bottom contact pad overlaps and is coupled to the first plated through hole via and the first end portion of the bottom passive device, and the second bottom contact pad overlaps and is coupled to the second plated through hole via and the second end portion of the bottom passive device, wherein the top passive device recess and the bottom passive device recess are positioned vertically above one another in a core layer positioned between the top metallization layer and the bottom metallization layer.

* * * * *